(12) United States Patent
Bajkowski et al.

(10) Patent No.: US 7,450,454 B1
(45) Date of Patent: Nov. 11, 2008

(54) LOW VOLTAGE DATA PATH IN MEMORY ARRAY

(75) Inventors: Maciej Bajkowski, Austin, TX (US); Hamed Ghassemi, Austin, TX (US); Huy B. Nguyen, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 2 days.

(21) Appl. No.: 11/746,126

(22) Filed: May 9, 2007

(51) Int. Cl.
   *G11C 7/00* (2006.01)
(52) U.S. Cl. .................. 365/205; 365/190; 365/207
(58) Field of Classification Search .............. 327/55
   See application file for complete search history.

(56) References Cited

U.S. PATENT DOCUMENTS

| | | | | |
|---|---|---|---|---|
| 4,616,342 A * | 10/1986 | Miyamoto | ............. | 365/189.05 |
| 5,696,721 A | 12/1997 | McAdams et al. | | |
| 5,786,723 A | 7/1998 | Kim | | |
| 5,825,205 A | 10/1998 | Ohtsuka | | |
| 5,973,955 A | 10/1999 | Nogle et al. | | |
| 6,621,758 B2 | 9/2003 | Cheung et al. | | |
| 6,728,145 B2 * | 4/2004 | Knupfer et al. | ........ | 365/189.03 |
| 6,842,059 B1 | 1/2005 | Wu | | |
| 7,088,630 B2 * | 8/2006 | Hung et al. | ............. | 365/185.2 |
| 2005/0057976 A1 | 3/2005 | Joo et al. | | |
| 2005/0078508 A1 | 4/2005 | Chan et al. | | |
| 2006/0262620 A1 | 11/2006 | Goldman et al. | | |

FOREIGN PATENT DOCUMENTS

JP 08-051351 2/1996
JP 09-106677 4/1997

OTHER PUBLICATIONS

PCT Search report and Written Opinion for corresponding PCT Application No. PCT/US08/61707 mailed Jul. 25, 2008.

* cited by examiner

*Primary Examiner*—Tan T. Nguyen
(74) *Attorney, Agent, or Firm*—James L. Clingan, Jr.; David G. Dolezal

(57) ABSTRACT

A data path of a memory is from an array of the memory, through a sense amplifier, through NOR gates, through N channel transistors, and through a latch that provides an output. The sense amplifier provides complementary data to the NOR gates which provide an output to the N channel transistors. The NOR gates provide outputs to the latch. This has the affect of providing outputs to gates of one inverter and drains of another inverter. Additional P channel transistors are in series with the inverters of the latch. The P channel transistor that is in series with the inverters whose drains are receiving the signal is made to be nonconductive by the output of the NOR gate to block current flow to the N channel transistor that is providing the input to the latch. The blocking of the current reduces the amount of current that the N channel transistor has to sink. This enables the N channel transistor, even at a reduced voltage, to be sufficiently conductive to flip the state of the latch.

20 Claims, 2 Drawing Sheets

US 7,450,454 B1

LOW VOLTAGE DATA PATH IN MEMORY ARRAY

CROSS-REFERENCE TO A RELATED APPLICATION

This application is related to U.S. patent application Ser. No. 11/672,279, filed Feb. 7, 2007, entitled "Circuit For Use In A Multiple Block Memory," naming Hamed Ghassemi as inventor, and assigned to the current assignee hereof.

BACKGROUND

1. Field

This disclosure relates generally to memories, and more specifically, to memories having a low voltage data path.

2. Related Art

As feature sizes continue to shrink, the requirement for lower voltage operation also continues. The lower voltage is beneficial in requiring less power but it is also necessary because the transistors with reduced feature sizes can only withstand a limited voltage. This is a problem with regard to all portions of a device. Other things generally beneficial are speed of operation and power consumption. Thus, any changes needed for one constraint, such as power supply voltage, should not adversely impact speed and power consumption. Transistors with reduced feature sizes often have both of the those benefits which also makes the lower feature sizes more desirable. The circuits that implement them though should still not adversely impact the inherent improvement in speed and power consumption. This includes the output data path in a memory.

Thus, there is a need for a memory data path that is operable at a lower voltage while taking into account speed and power consumption.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

A data path of a memory is from an array of the memory, through a sense amplifier, through NOR gates, through N channel transistors, and through a latch that provides an output. The sense amplifier provides complementary data to the NOR gates which provide an output to the N channel transistors. The NOR gates provide outputs to the latch. This has the affect of providing outputs to gates of one inverter and drains of another inverter. Additional P channel transistors are in series with the inverters of the latch. The P channel transistor that is in series with the inverters whose drains are receiving the signal is made to be nonconductive by the output of the NOR gate to block current flow to the N channel transistor that is providing the input to the latch. The blocking of the current reduces the amount of current that the N channel transistor has to sink. This enables the N channel transistor, even at a reduced voltage, to be sufficiently conductive to flip the state of the latch. This is better understood by reference to the drawings and the specification.

Figure 1:
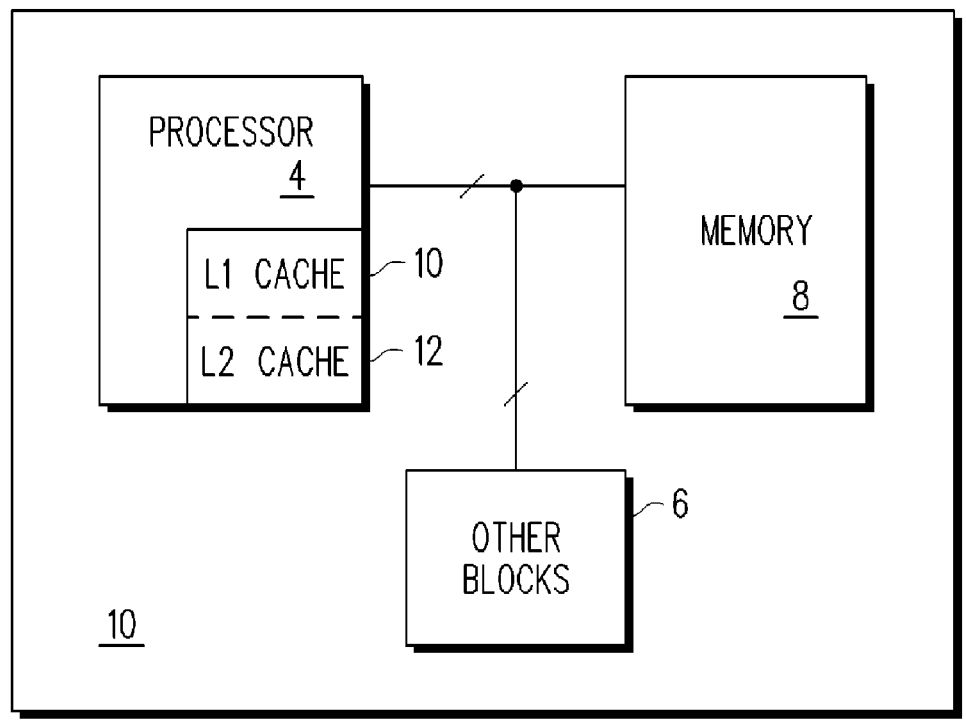
FIG. 1 is a block diagram of an integrated circuit having a memory using an embodiment of the invention.

Shown in FIG. 1 is a circuit 2 comprising a processor 4, other blocks 6, and a memory 8. Processor 4 further comprises an L1 cache 10 and an L2 cache 12. In this case caches 10 and 12 are memories useful in increasing the efficiency of processor 4. Processor 4 attempts to fetch from the L1 cache first then the L2 cache then memory 8. Processor 4 performs operations using these three memories as well as other blocks 6.

Figure 2:
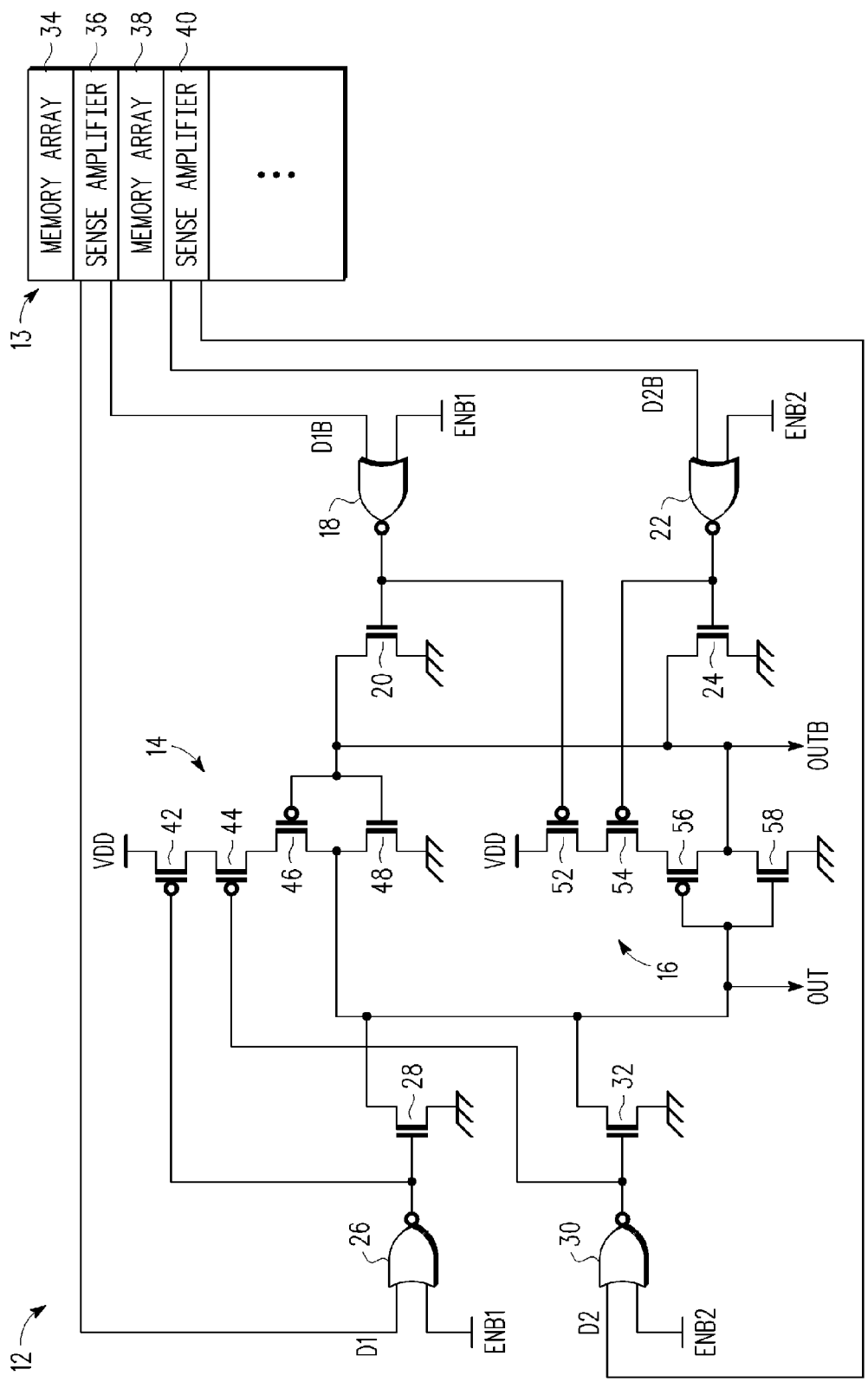
FIG. 2 is a combination block and circuit diagram showing a portion of a data path of FIG. 1 in more detail.

L2 cache 12 is shown in more detail in FIG. 2 as memory 12 which comprises an array portion 13, a special inverter 14, a special inverter 16, a NOR gate 18, an N channel transistor 20, a NOR gate 22, an N channel transistor 24, a NOR gate 26, an N channel transistor 28, a NOR gate 30, and an N channel transistor 32. Array portion 13 comprises an array 34, a sense amplifier 36, a memory array 38, and a sense amplifier 40. Array portion comprises additional memory arrays and sense amplifiers that are not individually identified. Special inverter 14 comprises an P channel transistor 46, an N channel transistor 48, a P channel transistor 42, and a P channel transistor 44. Special inverter 16 comprises an P channel transistor 56, an N channel transistor 58, a P channel transistor 52, and a P channel transistor 54. Special inverters 14 and 16 operate together as a latch. Sense amplifier 36 has a pair of complementary outputs D1 and D1B representative of a selected memory cell from memory array 34. Sense amplifier 36 may have other outputs representative of other memory cells going to other circuits. Sense amplifier 40 has a pair of complementary outputs D2 and D2B representative of a selected memory cell from memory array 38. Sense amplifier 40 may have other outputs representative of other memory cells going to other circuits.

NOR gate 18 has a first input for receiving output D1B, a second input for receiving an enable signal ENB1, and an output. Signal ENB1 is a signal that, when it is a logic low, allows NOR gate 18 to provide an output inverted from output D1B. NOR gate 22 has a first input for receiving output D2B, a second input for receiving an enable signal ENB2, and an output. Signal ENB2 is a signal that, when it is a logic low, allows NOR gate 22 to provide an output inverted from output D2B. NOR gate 26 has a first input for receiving output D1, a second input for receiving enable signal ENB1, and an output. Signal ENB1 is a signal that, when it is a logic low, allows NOR gate 26 to provide an output inverted from output D1. NOR gate 30 has a first input for receiving output D2, a second input for receiving enable signal ENB2, and an output. Signal ENB2 is a signal that, when it is a logic low, allows NOR gate 30 to provide an output inverted from output D2. Transistor 20 has a gate connected to the output of NOR gate 18, a source connected to ground, and a drain. Transistor 24 has a gate connected to the output of NOR gate 22, a source connected to ground, and a drain. Transistor 28 has a gate connected to the output of NOR gate 26, a source connected to ground, and a drain. Transistor 32 has a gate connected to the output of NOR gate 30, a source connected to ground, and a drain. Transistor 42 has a source connected to a positive power supply terminal VDD, a gate connected to the output of NOR gate 26, and drain. Transistor 44 has a source connected to the drain of transistor 42, a gate connected to the output of NOR gate 30 and a drain. Transistor 46 has a source connected to the drain of transistor 44, a gate connected to the drains of transistors 20 and 24, and a drain. Transistor 48 has a drain connected to the drain of transistor 46, a gate connected to the gate of transistor 46, and a source connected to ground. Transistor 52 has a source connected to a positive power supply terminal VDD, a gate connected to the output of NOR gate 18, and drain. Transistor 54 has a source connected to the drain of transistor 52, a gate connected to the output of NOR gate 22 and a drain. Transistor 56 has a source connected to the drain of transistor 54, a gate connected to the drains of transistors 28, 32, 46, and 48, and a drain connected to the gates of transistors 46 and 48 and the drains of transistors 20 and 24. Transistor 58 has a drain connected to the drain of transistor 56, a gate connected to the gate of transistor 56, and a source connected to ground. The drains of transistors 46 and 48 provide an output OUT. The drains of transistors 56 and 58 provide an output OUTB which is complementary to output OUT. The order of transistors 42 and 44 can be reversed. Transistors 42 and 44 are in series with each other and with the inverter comprised of transistors 46 and 48. This is also true for transistors 52 and 54.

In operation, array portion 13 provides data from memory arrays 34 and 38 through sense amplifiers 36 and 40 as complementary signals when these signals are representing the logic state of a selected memory cell. This is often called the active cycle of the memory, in this case memory 12. When not in the active cycle, often called the precharge cycle, signals D1, D1B, D2, and D2B are held to a logic high. Enable signal signals ENB1 and ENB2 are also held to a logic high. This causes NOR gates 18, 22, 26, and 30 to provide logic low signals as outputs which causes transistors 42, 44, 52, and 54 to be conductive. With transistors 42, 44, 52, and 54 conductive, inverters 14 and 16 function as a latch to hold the last logic state provided as outputs OUT and OUTB. During an active cycle, one pair of NOR gates, either NOR gates 18 and 26 or NOR gates 22 and 30 will be enabled by enable signal ENB1 or ENB2, respectively, by switching to a logic low. The logic low then allows the pair of NOR gates receiving the logic low to be responsive to their other input. For the example of sense amplifier 36 providing the data that is to be output, NOR gates 18 and 26 receive sensed data from sense amplifier 36. When there has been sufficient time for sense amplifier 36 to have performed its sensing function and provided valid data to NOR gates 18 and 26, enable signal ENB1 is enabled to a logic low state so that NOR gates 18 and 26 respond to output signals D1 and D1B. For the example of output D1 being a logic high and thus D1B being a logic low, P channel transistor 52 is made to be non-conductive and transistor 20 is made to be conductive. The drain of transistor 20 is connected to the gates of transistors 46 and 48 to cause transistor 48 to be non-conductive and transistor 46 to be conductive. The drain of transistor 20, however, is also coupled to the drains of transistors 56 and 58 as a consequence of inverters 14 and 16 being connected to form a latch. Previously, for the case where the latch was providing a logic high for OUTB, transistor 56 would have been conductive and coupling VDD to the OUTB node. N channel transistor 20 becoming conductive would have been thus drawing current through transistor 56, making it more difficult to cause transistor 46 to become conductive. With a lower power supply voltage and thus a lower voltage as the logic high on the gate of transistor 20, transistor 20 would not have enough drive strength to overcome the current being supplied through transistor 56 to cause transistor 46 to flip states from non-conductive to sufficiently conductive to cause transistor 58 to become conductive. With output of NOR gate 18 coupled to transistor 52 causing transistor 52 to become non-conductive, the current path from VDD to transistor 56 is blocked, preventing current being supplied through transistor 56 to transistor 20. Without the extra current load through transistor 56, transistor 46 can be made conductive by transistor 20 even with reduced voltage drive on the gate of transistor 20. By ensuring the current path from VDD to transistor 56 is blocked, transistor 20 causes transistor 46 to be conductive more quickly thus increasing speed. Also, current is saved. Thus, there are benefits of speed, power consumption, and operability at reduced voltage.

In this example of output D1B being a logic low, output D1 is a logic high which keeps NOR gate 26 providing a logic low output so that transistor 28 is retained in a non-conductive state. Transistor 42 remains conductive with the output of NOR gate 26 remaining at a logic low. Similarly for NOR gates 22 and 30, enable signal ENB2 is a kept at a logic high as are outputs D2 and D2B which keep NOR gates 22 and 30 providing a logic low output. This keeps transistors 54 and 44 conductive. Analogous operation is provided for output signal D1 being a logic low and signal D1B being a logic high. In such case transistor 42 becomes non-conductive while P channel transistors 44, 52, and 54 remain conductive. Transistor 42 blocks the current path from VDD to transistor 46 and thus prevents transistor 46 from providing additional current that conductive transistor 28 has to sink. Thus transistor 28 can cause transistor 56 to become conductive which can in turn causes transistor 48 to become conductive. The same type of operation occurs for the case in which enable signal ENB2 is enabled. In such case NOR gates 22 and 30 are responsive to their inputs that receive signals D2 and D2B so that one of transistors 44 or 54 is made non-conductive. This allows the N channel pull down transistor, either transistor 24 or 32, to efficiently and reliably cause the corresponding P channel transistor 46 or 56, respectively, to become conductive.

By now it should be appreciated that a circuit useful for a data path in a memory has been described. The circuit includes a first sense amplifier providing a set of outputs, wherein the set includes a first true output and a first complementary output. The circuit further includes a first input coupled to the first true output. The circuit further includes a second input coupled to the first complementary output. The circuit further includes a first N-channel transistor including a gate connected to the first input. The circuit further includes a second N-channel transistor including a gate connected to the second input. The circuit further includes a pair of cross coupled inverters, wherein the pair includes a first inverter and a second inverter. The first inverter includes a first P-channel transistor and a third N-channel transistor, a gate of the first P-channel transistor and a gate of the third N-channel transistor are connected to a first node, a first current terminal of the first P-channel transistor and a first current terminal of the third N-channel transistor are connected to a second node. The second inverter includes a second P-channel transistor and a fourth N-channel transistor, a gate of the second P-channel transistor and a gate of the fourth N-channel transistor are connected to the second node, a first current terminal of the second P-channel transistor and a first current terminal of the fourth N-channel transistor are connected to the first node. The circuit further includes a third P-channel transistor including a gate connected to the first input. The circuit further includes a fourth P-channel transistor including a gate connected to the second input. The third P-channel transistor and the first P-channel transistor are stacked in series. The fourth P-channel transistor and the second P-channel transistor are stacked in series. The circuit may further comprise a second sense amplifier, third and fourth inputs, and fifth and sixth N and P channel transistors. The second sense amplifier provides a second set of outputs, wherein the second set includes a second true output and a second complementary output. The third input is coupled to the second true output. The fourth input is coupled to the second complementary output. The fifth N-channel transistor includes a gate connected to the third input. The sixth N-channel transistor includes a gate connected to the fourth input. The fifth P-channel transistor includes a gate connected to the third input. The sixth P-channel transistor includes a gate connected to the fourth input. The third P-channel transistor, the fifth P-channel transistor, and the first P-channel transistor are stacked in series. The fourth P-channel transistor, the sixth P-channel transistor, and the second P-channel transistor are stacked in series. The circuit may further comprise a first NOR gate and a second NOR gate. The first NOR gate including an output connected to the first input, the first NOR gate including an input coupled to the first true output. The second NOR gate including an output connected to the second input, the second NOR gate including an input coupled to the first complementary output. The first NOR gate may include an input connected to an enable signal line. The second NOR gate may include an input connected to the enable signal line. The first N-channel transistor may include a first current terminal connected to the second node. The second N-channel transistor includes a first current terminal connected to the first node. The circuit may further include a power supply terminal. The third P-channel transistor may be located in a transistor stack and be between the first P-channel transistor and the power supply terminal. The fourth P-channel transistor may be located in a transistor stack and be between the second P-channel transistor and the power supply terminal. The first P-channel transistor may include a second current terminal, the third P-channel transistor may include a first current terminal and a second current terminal; and the second current terminal of the first P-channel transistor may be connected to the first current terminal of the third P-channel transistor. The circuit may further comprise a memory array and the sense amplifier may be operably coupled the memory array for providing values at the first true output and the first complementary output that are indicative of a value stored in the memory array. The circuit may further comprise a cache in which the cache includes the memory array, the first sense amplifier, the first input, the second input, the first N-channel transistor, the second N-channel transistor, the pair of cross coupled inverters, the third P-channel transistor, and the fourth P-channel transistor. The circuit may further include a processor that includes the cache.

A circuit useful for a data path in a memory has also been described as follows. The circuit includes a first sense amplifier providing a first set of outputs, wherein the first set includes a first true output and a first complementary output. The circuit further includes a second sense amplifier providing a second set of outputs, wherein the second set includes a second true output and a second complementary output. The circuit further includes a latch circuit including a first input coupled to the first true output, a second input coupled to the first complementary output, a third input coupled to the second true output, and a fourth input coupled to the second complementary data. The latch includes a first N-channel transistor including a gate connected to the first input, a second N-channel transistor including a gate connected to the second input, a third N-channel transistor including a gate connected to the third input, a fourth N-channel transistor including a gate connected to the fourth input, and a pair of cross coupled inverters. The pair includes a first inverter and a second inverter. The first inverter includes a first P-channel transistor and a fifth N-channel transistor, a gate of the first P-channel transistor and a gate of the fifth N-channel transistor are connected to a first node, a first current terminal of the first P-channel transistor and a first current terminal of the fifth N-channel transistor are connected to a second node. The second inverter includes a second P-channel transistor and a sixth N-channel transistor, a gate of the second P-channel transistor and a gate of the sixth N-channel transistor are connected to the second node, a first current terminal of the second P-channel transistor and a first current terminal of the sixth N-channel transistor are connected to the first node. The circuit further includes a third P-channel transistor including a gate connected to the first input. The circuit further includes a fourth P-channel transistor including a gate connected to the third input. The circuit further includes a fifth P-channel transistor including a gate connected to the second input. The circuit further includes a sixth P-channel transistor including a gate connected to the fourth input. The third P-channel transistor, the fourth P-channel transistor, and the first P-channel transistor are stacked in series. The fifth P-channel transistor, the sixth P-channel transistor, and the second P-channel transistor are stacked in series. The circuit may further comprise first, second, third, and fourth NOR gates. The first NOR gate includes an output connected to the first input and an input coupled to the first true output. The second NOR gate includes an output connected to the second input and an input coupled to the first complementary output. The third NOR gate includes an output connected to the third input and an input coupled to the second true output. The fourth NOR gate includes an output connected to the fourth input and input coupled to the second complementary output. The first NOR gate may include an input connected to a first enable signal line, the second NOR gate may include an input connected to the first enable signal line, the third NOR gate may include an input connected to a second enable signal line, and the fourth NOR gate may include an input connected to the second enable signal line. The first N-channel transistor may include a first current terminal connected to the second node, the third N-channel transistor may include a first current terminal connected to the second node, the second N-channel transistor may include a first current terminal connected to the first node, and the fourth N-channel transistor may include a first current terminal connected to the first node. The circuit may further include a power supply in which the third P-channel transistor and the fourth P-channel transistor are located in a transistor stack and are between the first P-channel transistor and the power supply terminal and the fifth P-channel transistor and sixth P-channel transistor are located in a transistor stack and are between the second P-channel transistor and the power supply terminal. The circuit may be further characterized in that the first P-channel transistor includes a second current terminal, the third P-channel transistor includes a first current terminal and a second current terminal, the fourth P-channel transistor includes a first current terminal and a second current terminal, the second current terminal of the first P-channel transistor is connected to the first current terminal of the fourth P-channel transistor, and the second current terminal of the fourth P-channel transistor is connected to the first current terminal of the third P-channel transistor. The circuit may be further characterized in that the first sense amplifier is operably coupled a memory array for providing values at the first true output and the first complementary output that are indicative of values stored in the memory array, and the second sense amplifier is operably coupled to a second memory array for providing values at the second true output and the second complementary output that are indicative of values stored in the memory array. The circuit may further comprise a cache, wherein the first sense amplifier, the second sense amplifier, and the latch circuit are implemented in the cache. The circuit may further comprise a processor in which the processor includes the cache.

A method of operating a memory is also described. The memory includes a latch. The latch includes a pair of cross coupled inverters with each inverter of the pair including an N-channel transistor and a P-channel transistor stacked in series between a first power supply terminal and a second power supply terminal. The method includes reading a value stored in a memory array and placing a voltage at an input of a first inverter of the pair at a logic low voltage level while enabling a current path from the first power supply terminal to an output of the first inverter via a first P-channel transistor of the first inverter and while disabling a current path between a second P-channel transistor of a second inverter of the pair and the first power supply terminal. The method further includes, during a non reading operating state, enabling a current path from the first power supply terminal to a first current terminal of the first P-channel transistor and enabling a current path from the first power supply terminal to the second P-channel transistor.

Although the invention is described herein with reference to specific embodiments, various modifications and changes can be made without departing from the scope of the present invention as set forth in the claims below. For example, only two pairs of complementary output signals are being received by the latch but more than two may be supplied. This could be implemented with additional pairs of NOR gates, pairs of N channel pull-down transistors, and pairs of P channel blocking transistors for each additional pair of complementary output signals. Also instead of a plurality of pairs of complementary signals there may be only one pair. This could then be implemented with just one pair of NOR gates, one pair of N channel pull-downs, and one pair of P channel blocking transistors. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling. The term "connected" is intended to mean direct coupling, but just because something is described as being connected to something else in the specification does not mean that is necessarily the case in order to perform the invention.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A circuit comprising:
   a first sense amplifier providing a set of outputs, wherein the set includes a first true output and a first complementary output;
   a first input coupled to the first true output;
   a second input coupled to the first complementary output;
   a first N-channel transistor including a gate connected to the first input;
   a second N-channel transistor including a gate connected to the second input;
   a pair of cross coupled inverters wherein the pair includes:
      a first inverter, the first inverter includes a first P-channel transistor and a third N-channel transistor, a gate of the first P-channel transistor and a gate of the third N-channel transistor are connected to a first node, a first current terminal of the first P-channel transistor and a first current terminal of the third N-channel transistor are connected to a second node;
      a second inverter, the second inverter includes a second P-channel transistor and a fourth N-channel transistor, a gate of the second P-channel transistor and a gate of the fourth N-channel transistor are connected to the second node, a first current terminal of the second P-channel transistor and a first current terminal of the fourth N-channel transistor are connected to the first node;
   a third P-channel transistor including a gate connected to the first input; and
   a fourth P-channel transistor including a gate connected to the second input;
   wherein the third P-channel transistor and the first P-channel transistor are stacked in series; and
   wherein the fourth P-channel transistor and the second P-channel transistor are stacked in series.

2. The circuit of claim 1 further comprising:
   a second sense amplifier providing a second set of outputs, wherein the second set includes a second true output and a second complementary output;
   a third input coupled to the second true output;
   a fourth input coupled to the second complementary output;
   a fifth N-channel transistor including a gate connected to the third input;
   a sixth N-channel transistor including a gate connected to the fourth input;
   a fifth P-channel transistor including a gate connected to the third input;
   a sixth P-channel transistor including a gate connected to the fourth input;
   wherein the third P-channel transistor, the fifth P-channel transistor, and the first P-channel transistor are stacked in series; and
   wherein the fourth P-channel transistor, the sixth P-channel transistor, and the second P-channel transistor are stacked in series.

3. The circuit of claim 1 further comprising:
   a first NOR gate, the first NOR gate including an output connected to the first input, the first NOR gate including an input coupled to the first true output; and
   a second NOR gate, the second NOR gate including an output connected to the second input, the second NOR gate including an input coupled to the first complementary output.

4. The circuit of claim 3 wherein:
   the first NOR gate includes an input connected to an enable signal line; and
   the second NOR gate includes an input connected to the enable signal line.

5. The circuit of claim 1 wherein:
   the first N-channel transistor includes a first current terminal connected to the second node; and
   the second N-channel transistor includes a first current terminal connected to the first node.

6. The circuit of claim 1 further comprising:
a power supply terminal;
wherein the third P-channel transistor is located in a transistor stack and is between the first P-channel transistor and the power supply terminal;
wherein the fourth P-channel transistor is located in a transistor stack and is between the second P-channel transistor and the power supply terminal.

7. The circuit of claim 1 wherein:
the first P-channel transistor includes a second current terminal;
the third P-channel transistor includes a first current terminal and a second current terminal; and
the second current terminal of the first P-channel transistor is connected to the first current terminal of the third P-channel transistor.

8. The circuit of claim 1 further comprising:
a memory array; and
the sense amplifier is operably coupled the memory array for providing values at the first true output and the first complementary output that are indicative of a value stored in the memory array.

9. The circuit of claim 8 further comprising:
a cache, the cache including the memory array, the first sense amplifier, the first input, the second input, the first N-channel transistor, the second N-channel transistor, the pair of cross coupled inverters, the third P-channel transistor, and the fourth P-channel transistor.

10. The circuit of claim 9 further comprising:
a processor, the processor includes the cache.

11. A circuit comprising:
a first sense amplifier providing a first set of outputs, wherein the first set includes a first true output and a first complementary output;
a second sense amplifier providing a second set of outputs, wherein the second set includes a second true output and a second complementary output;
a latch circuit including a first input coupled to the first true output, a second input coupled to the first complementary output, a third input coupled to the second true output, and a fourth input coupled to the second complementary data, the latch circuit includes:
  a first N-channel transistor including a gate connected to the first input;
  a second N-channel transistor including a gate connected to the second input;
  a third N-channel transistor including a gate connected to the third input;
  a fourth N-channel transistor including a gate connected to the fourth input;
  a pair of cross coupled inverters wherein the pair includes:
    a first inverter, the first inverter includes a first P-channel transistor and a fifth N-channel transistor, a gate of the first P-channel transistor and a gate of the fifth N-channel transistor are connected to a first node, a first current terminal of the first P-channel transistor and a first current terminal of the fifth N-channel transistor are connected to a second node; and
    a second inverter, the second inverter includes a second P-channel transistor and a sixth N-channel transistor, a gate of the second P-channel transistor and a gate of the sixth N-channel transistor are connected to the second node, a first current terminal of the second P-channel transistor and a first current terminal of the sixth N-channel transistor are connected to the first node;
a third P-channel transistor including a gate connected to the first input;
a fourth P-channel transistor including a gate connected to the third input;
a fifth P-channel transistor including a gate connected to the second input; and
a sixth P-channel transistor including a gate connected to the fourth input;
wherein the third P-channel transistor, the fourth P-channel transistor, and the first P-channel transistor are stacked in series; and
wherein the fifth P-channel transistor, the sixth P-channel transistor, and the second P-channel transistor are stacked in series.

12. The circuit of claim 11 further comprising:
a first NOR gate, the first NOR gate including an output connected to the first input, the first NOR gate including an input coupled to the first true output;
a second NOR gate, the second NOR gate including an output connected to the second input, the second NOR gate including an input coupled to the first complementary output;
a third NOR gate, the third NOR gate including an output connected to the third input, the third NOR gate including an input coupled to the second true output; and
a fourth NOR gate, the fourth NOR gate including an output connected to the fourth input, the fourth NOR gate including an input coupled to the second complementary output.

13. The circuit of claim 12 wherein:
the first NOR gate includes an input connected to a first enable signal line;
the second NOR gate includes an input connected to the first enable signal line;
the third NOR gate includes an input connected to a second enable signal line; and
the fourth NOR gate includes an input connected to the second enable signal line.

14. The circuit of claim 11 wherein:
the first N-channel transistor includes a first current terminal connected to the second node;
the third N-channel transistor includes a first current terminal connected to the second node;
the second N-channel transistor includes a first current terminal connected to the first node; and
the fourth N-channel transistor includes a first current terminal connected to the first node.

15. The circuit of claim 11 further comprising:
a power supply terminal;
wherein the third P-channel transistor and the fourth P-channel transistor are located in a transistor stack and are between the first P-channel transistor and the power supply terminal; and
wherein the fifth P-channel transistor and sixth P-channel transistor are located in a transistor stack and are between the second P-channel transistor and the power supply terminal.

16. The circuit of claim 11 wherein:
the first P-channel transistor includes a second current terminal;
the third P-channel transistor includes a first current terminal and a second current terminal;
the fourth P-channel transistor includes a first current terminal and a second current terminal;

the second current terminal of the first P-channel transistor is connected to the first current terminal of the fourth P-channel transistor; and the second current terminal of the fourth P-channel transistor is connected to the first current terminal of the third P-channel transistor.

17. The circuit of claim 11 further wherein:

the first sense amplifier is operably coupled a memory array for providing values at the first true output and the first complementary output that are indicative of values stored in the memory array; and the second sense amplifier is operably coupled to a second memory array for providing values at the second true output and the second complementary output that are indicative of values stored in the memory array.

18. The circuit of claim 11 further comprising:

a cache, wherein the first sense amplifier, the second sense amplifier, and the latch circuit are implemented in the cache.

19. The circuit of claim 18 further comprising:

a processor, wherein the processor includes the cache.

20. A method of operating a memory, the memory including a latch, the latch including a pair of cross coupled inverters with each inverter of the pair including an N-channel transistor and a P-channel transistor stacked in series between a first power supply terminal and a second power supply terminal, the method comprising:

reading a value stored in a memory array and placing a voltage at an input of a first inverter of the pair at a logic low voltage level while enabling a current path from the first power supply terminal to the output of the first inverter via a first P-channel transistor of the first inverter and while disabling a current path between a second P-channel transistor of the second inverter and the first power supply terminal; and during a non reading operating state, enabling a current path from the first power supply terminal to a first current terminal of the first P-channel transistor and enabling a current path from the first power supply terminal to the second P-channel transistor.

\* \* \* \* \*